United States Patent [19]
Schwalke et al.

[11] Patent Number: 5,872,382
[45] Date of Patent: Feb. 16, 1999

[54] LOW JUNCTION LEAKAGE MOSFETS WITH PARTICULAR SIDEWALL SPACER STRUCTURE

[75] Inventors: Udo Schwalke, Heldenstein; Heinz Zeininger, Obermichelbach, both of Germany

[73] Assignee: Siemens Aktiengesellschaft, Munich, Germany

[21] Appl. No.: 908,125

[22] Filed: Aug. 11, 1997

Related U.S. Application Data

[63] Continuation of Ser. No. 707,019, Sep. 10, 1996, abandoned, which is a continuation of Ser. No. 417,420, Apr. 5, 1995, abandoned, which is a division of Ser. No. 208,548, Mar. 9, 1994, Pat. No. 5,439,831.

[51] Int. Cl.$^6$ .......................... H01L 29/76; H01L 29/94; H01L 27/088
[52] U.S. Cl. ..................... 257/408; 257/344; 257/900
[58] Field of Search ................... 257/369, 371, 257/377, 382, 383, 384, 385

[56] References Cited

U.S. PATENT DOCUMENTS

| | | | |
|---|---|---|---|
| 4,558,507 | 12/1985 | Okaybayashi et al. | 257/383 |
| 4,755,479 | 7/1988 | Miura | 257/900 |
| 5,164,801 | 11/1992 | Hieda et al. | 257/900 |
| 5,182,619 | 1/1993 | Pfiester | 257/382 |
| 5,235,204 | 8/1993 | Tsai | 257/408 |
| 5,278,441 | 1/1994 | Kang et al. | 257/900 |
| 5,304,827 | 4/1994 | Malhi et al. | 257/336 |
| 5,424,571 | 6/1995 | Liou | 257/408 |

*Primary Examiner*—Wael Fahmy
*Attorney, Agent, or Firm*—Stanton C. Braden

[57] ABSTRACT

Shallow junction field effect transistors are made by a low temperature process comprising ion implanting source/drain regions through a buffer layer in two steps, the first an ion implant at high dosage and low energy and the second an ion implant at low dosage and high energy. Ion implantation through the buffer layer avoids crystallographic damage to the silicon substrate. By grading the sidewall spacers of the gate electrode, more or fewer ions can be implanted through the spacer foot to ensure continuity between the source/drain regions and the channel region under the gate electrode.

5 Claims, 3 Drawing Sheets

LOW JUNCTION LEAKAGE MOSFETS WITH PARTICULAR SIDEWALL SPACER STRUCTURE

CROSS REFERENCE TO RELATED APPLICATION

This is a continuation of Ser. No. 08/707,019 filed Sept. 10, 1996 now abandoned, which is a continuation of Ser. No. 08/417,420 filed Apr. 5, 1995 now abandoned which is a divisional of Ser. No. 08/208,548 filed Mar. 9, 1994 now U.S. Pat. No. 5,439,831.

This invention relates to improved metal-oxide-semiconductor field effect transistors (hereinafter MOSFETs) for integrated circuits for memory or logic applications and method of making them. More particularly, this invention relates to MOSFETs having reduced junction leakage and improved device performance and reliability and method of making them.

BACKGROUND OF THE INVENTION

As the number of devices made on a single semiconductor substrate (silicon wafer) increases and the relative size of the devices decreases, problems both of performance and manufacturability arise. In the manufacture of MOSFETs, shallow (<0.25 micron), low resistivity p-type source/drain (hereinafter S/D) regions in an n-type well are subject to low junction breakdown and high junction capacitance. Thus graded S/D regions have been suggested. These junctions have less abrupt changes in their doping profile across the junction, and higher breakdown voltage and lower junction capacitance. These graded junctions can be made by ion implanting a first implant (such as boron) at low energy and high dosage to give a pre-selected resistivity, followed by a second implant (also boron) at high energy and low dosage which sets the breakdown characteristics of the junction. These ion implant steps must be followed by an annealing step to redistribute the dopant and to heal any implant damage to the silicon crystal.

For example, Woo et al in U.S. Pat. No. 4,757,026 describes manufacture of MOSFETs having graded S/D junctions. According to the process described, two mask layers are deposited, and the second mask layer anisotropically etched to leave spacers of the second mask layer on sidewalls of an insulated gate electrode. A high dosage ion implant is carried out through the first mask layer and a high temperature anneal carried out to repair damage to the substrate. The spacers prevent ions from penetrating into the substrate adjacent the gate. The spacers are them removed and a second, low dosage ion implant is carried out, thereby implanting the substrate adjacent to the gate. A second anneal is then carried out.

A graded junction device of Woo et al is shown in FIG. 1 and comprises a high resistivity n-well 10; a thick field oxide region 11 overlying a portion of the n-well 10; a thin gate oxide layer 12 overlying a portion of the well 10 that forms the gate, and includes a channel region 13 in the substrate; a conductive gate layer 16 overlying the channel region 13 and the gate oxide layer 12; a low resistivity p-type S/D region 14 between the field oxide region 11 and the gate 16; and a high resistance p-type grading region 15 surrounding the S/D region 14 and separating it from the n-type well 10. Such a structure increases the breakdown voltage of a junction because of the separation of the heavily doped region and the n-type well; reduces the junction capacitance for the same reason; and reduces the effective gate length because of encroachment of the grading region under the gate oxide. However, a drive-in step is required between implant steps comprising heating at high temperatures for extended periods to activate and diffuse the ion implanted ions vertically into the silicon substrate. Another high temperature annealing step is required after the second ion implant to heal damage to the silicon substrate caused by the ion implantation. This crystal damage provides nucleation centers for the formation of dislocations and must be removed entirely.

However, as the width of various device components of transistors, including the S/D regions and gates, become smaller, the vertical depth of S/D regions must also be controlled, and the S/D regions are required to be shallower. Thus sub-micron CMOS manufacturing requires restriction to low temperature manufacturing because of the need to decrease vertical dopant diffusion to achieve very shallow S/D junctions and channel profiles.

In order to obtain shallow junctions, the processing temperatures must be limited to obtain control of the dopant diffusion vertically into the bulk silicon, while allowing some lateral diffusion of the dopants to ensure some overlap of the gate/channel regions and S/D junctions, thereby ensuring continuity between these regions. This continuity is required for current drive capability and "hot electron" stability.

Since in general the diffusion coefficients vertically and laterally are about the same, this is a difficult maneuver.

Thus there are two competing manufacturing requirements; high temperature annealing is required to remove crystal damage to the silicon wafer, and low temperatures are required to obtain shallow S/D regions.

Ion implantation damage to a silicon crystal can be avoided by ion implanting through a polysilicon or doped silicide buffer layer. The ion implant damage is thus confined to the buffer layer, and does not damage the silicon crystal at all. Thus formation of dislocations and consequent junction leakage current will be reduced using ion implantation through a buffer layer. However, in the absence of a thermal heating step, the diffusion depth of the junction is insufficient, and thus good junction characteristics cannot be obtained. Further, insufficient out-diffusion from the polysilicon or silicide layer may cause more junction leakage via silicide spiking or tunneling. The out-diffusion of dopants under polysilicon is limited in the absence of high temperatures, and the presence of oxide residues at the polysilicon-silicon interface may block out-diffusion entirely, thereby degrading the junction characteristics. Incomplete out-diffusion also affects the lateral junction as well.

Thus improved shallow junction MOSFETs and method of manufacturing them which avoids high temperature processing has been sought.

SUMMARY OF THE INVENTION

Shallow junction MOSFETS in accordance with the invention are made by a low temperature process comprising depositing a metal silicide or polysilicon layer adjacent to the preformed gate electrode having spacers on the sidewalls, ion implanting a first dopant using a high dosage, low energy implant into the silicide or polysilicon layer, and ion implanting a second dopant through the silicide or polysilicon layer using a high dosage low energy implant. Since high dose ion implantation of the bulk silicon is avoided, no severe damage to the silicon crystal occurs. Out-diffusion of the implanted ions occurs during reflow anneal of a passivation and planarizing layer, which is a low temperature anneal, to obtain a shallow, graded S/D region for the MOSFET.

Independent optimization of both vertical and lateral out-diffusion can be obtained using a graded gate sidewall spacer. A graded spacer configuration both reduces stress at the spacer-silicon interface, and also allows some direct ion implantation in the region between the channel and S/D regions, thereby ensuring continuity of those regions.

DETAILED DESCRIPTION OF THE INVENTION

The present process combines junction formation by out-diffusion from an ion implanted buffer layer, such as a silicide or polysilicon layer, which eliminates crystal damage to the silicon substrate by ion implantation; and a second ion implant using a low dosage, high energy ion implant through the buffer layer to grade the junction. The present process will be described in connection with FIGS. 2A–2F.

Figure 1:
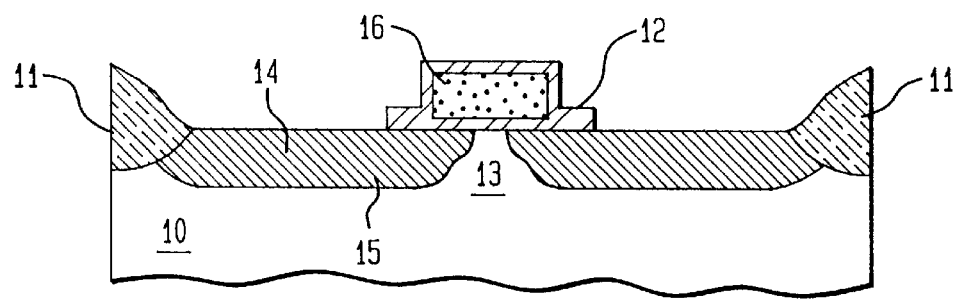
FIG. 1 is a prior art graded junction MOSFET.
Figure 2A:
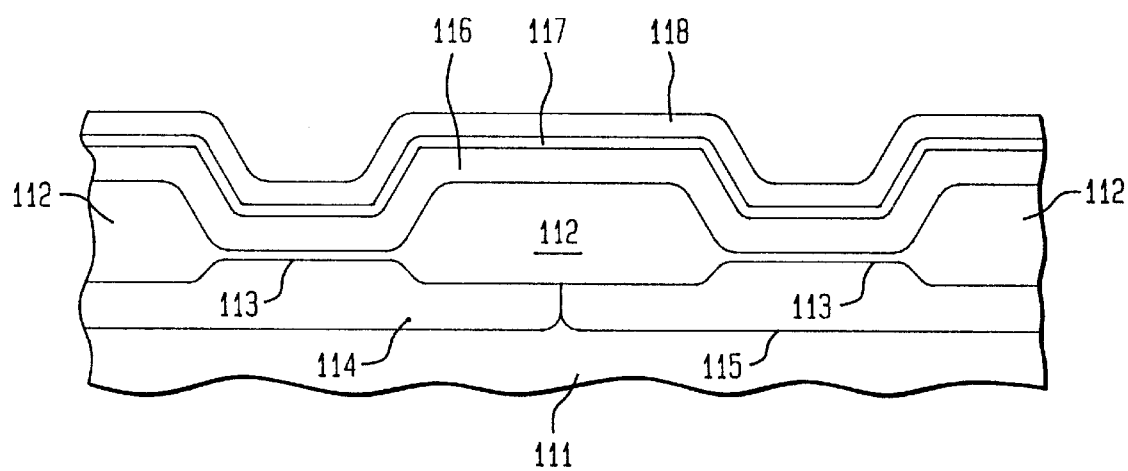
FIGS. 2A through 2F illustrate the process steps of the present invention during manufacture of CMOS devices.

For the formation of CMOS devices, alternating n-type wells and p-type wells are formed by ion implantation of a silicon substrate. Referring now to FIG. 2A, a silicon substrate is shown as 111, and the p-type wells 114 and n-type wells 115 are formed therein in known manner. Field oxide regions 112 and thin gate oxide regions 113 are also formed on the surface of the silicon wafer 111 in conventional manner. A blanket polysilicon layer 116, doped with phosphorus to a level of about $1 \times 10^{20}/cm^3$ to about $1 \times 10^{21} cm^2$, is deposited as the gate electrode material. An optional silicide layer 117 can be deposited over the gate electrode to enhance the gate conductivity, and a silicon oxide or silicon nitride cap layer 118 is deposited thereover. This cap layer 118 serves as a blocking layer to prevent ion implantation of the gate.

Figure 2B:
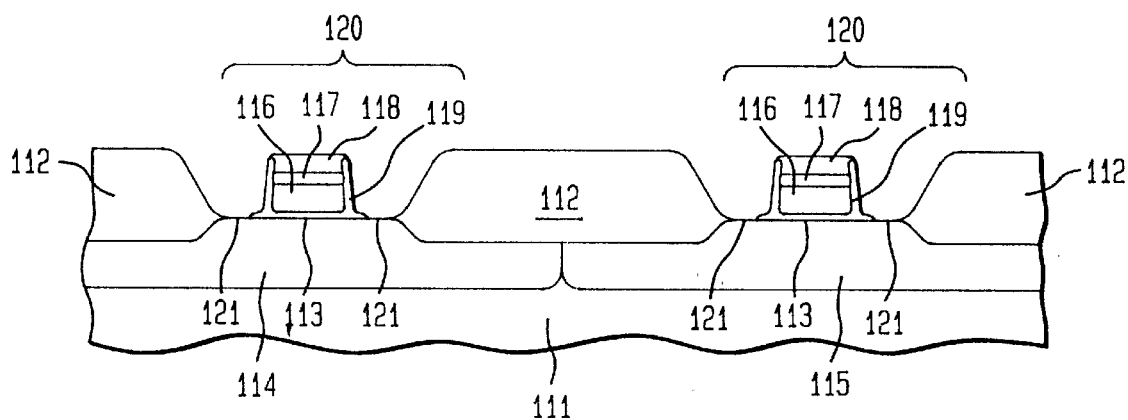

The gates are then formed by photolithographic techniques in conventional manner, the polycide stacks 116, 117, 118 are reoxidized to encapsulate the gate stack with a thin oxide layer, and a stress-free sidewall spacer 119 is formed on the sidewall of the gate stack 117, 118, 119. The source/drain regions 121 are opened to the silicon surface. The resultant gate structure 120 and S/D regions are shown in FIG. 2B.

Figure 2C:
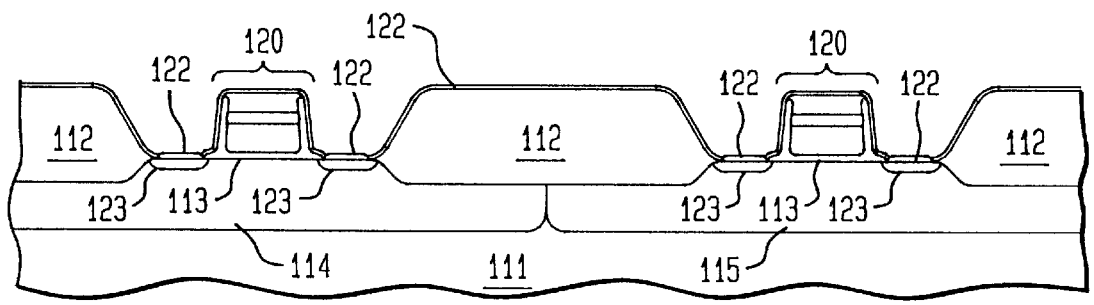

A buffer layer 123 is then deposited over the S/D regions 121. The buffer layer 123 can be polysilicon or a metal silicide layer, such as $CoSi_2$, using a self-aligned silicide process. This buffer layer ensures a reliable dopant out-diffusion layer. A thin layer of silicon oxide or silicon nitride 122 is deposited over the buffer layer 123 to minimize channeling and contamination effects during subsequent ion implantation steps. The resultant structure is shown in FIG. 2C.

Figure 2D:
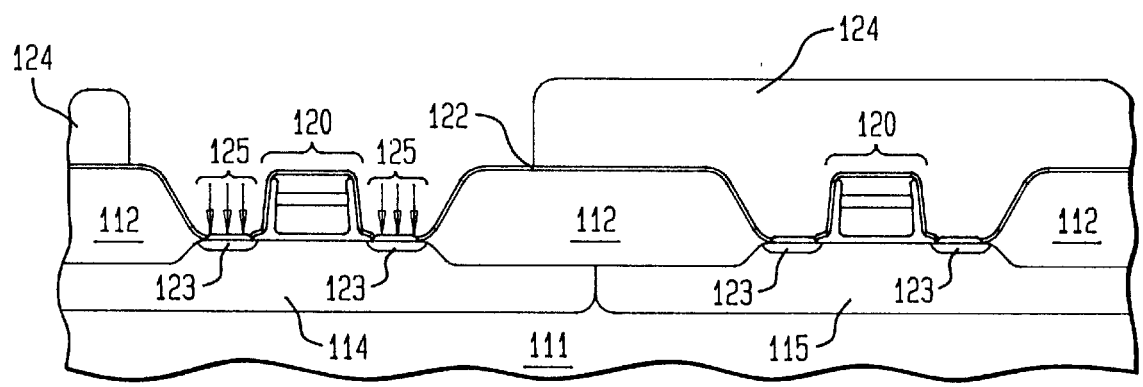

During formation of a source/drain region in the p-well, the n-well is blocked, as with a photoresist layer 124. When the source/drain region is made in the n-well, the p-well is blocked with photoresist. A first high dosage, low energy implant 125, such as of arsenic at $5 \times 10^{15}/cm^2$, 25 keV, is next performed into the buffer layer 123, as shown in FIG. 2D. This ion implant is completely confined to the buffer layer 123 and completely avoids crystal damage to the silicon substrate 111.

Figure 2E:
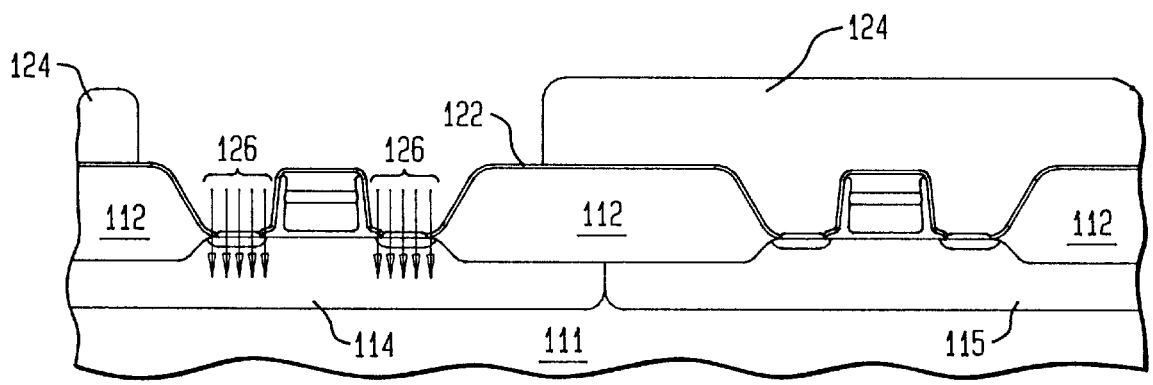

A second, low dosage, high energy ion implant is performed next, such as arsenic to a level of $5 \times 10^{14}/cm^2$ into the buffer layer 123, as shown in FIG. 2E. Ion implantation into the buffer layer 123 rather than into the bulk silicon wafer 111 again avoids any damage to the crystallographic structure of the silicon wafer 111.

In conventional manner, the n-well is blocked with photoresist and a p-type ion implant is made to form the source/drain regions in the p-well.

Figure 2F:
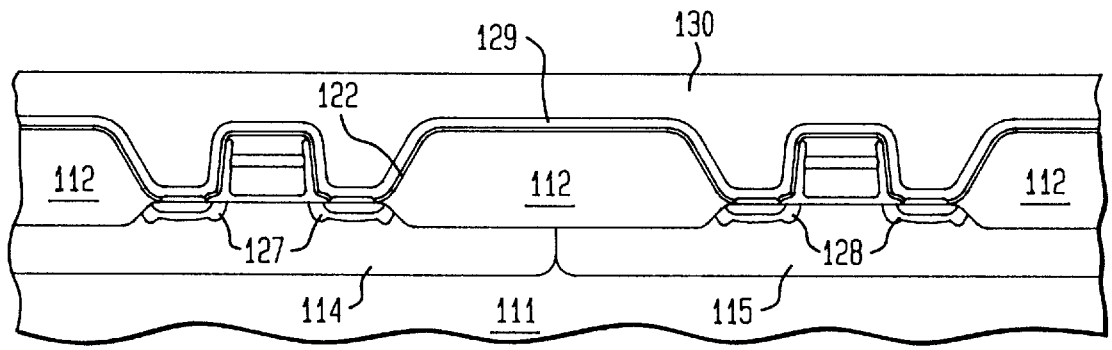

Another advantage of the present process is that the out-diffusion of the ion implants can be combined with a planarization step. For example, a first thin layer 129 (about 50 nm thick) of undoped silicon oxide is formed, such as by chemical vapor deposition of TEOS in known manner, and a borophosphosilicate glass (BPSG) layer 130 is then deposited. The BPSG layer 130 is reflowed by heating at temperatures of about 900° C. for about 50 minutes in nitrogen ambient to planarize the layer. This reflow step simultaneously activates the NFET and PFET source/drain junctions and forms shallow, graded junctions 127 and 128. The resultant structure is shown in FIG. 2F.

To complete the CMOS devices, the BPSG layer is pattern etched to form openings over the gate, source and drain regions. Metal contacts can then be deposited into these openings in conventional manner.

Devices made as described hereinabove utilizing the second, low dose, high energy ion implant increases the overlap capacitance by 30% over prior art devices made using a single, high dosage low energy ion implant followed by an anneal at 900° C. for five minutes. The reverse leakage of devices made in accordance with the method of the invention was improved by about three orders of magnitude.

Figure 3A:
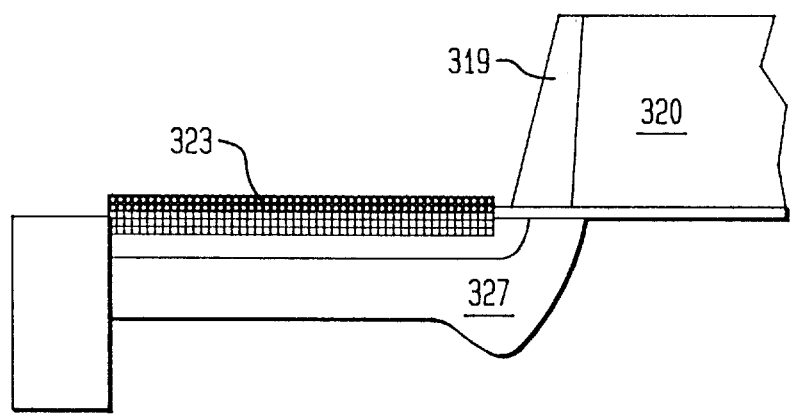
FIGS. 3A and 3B compare the conventional gate sidewall spacer and the graded sidewall spacer of the invention.
Figure 3B:
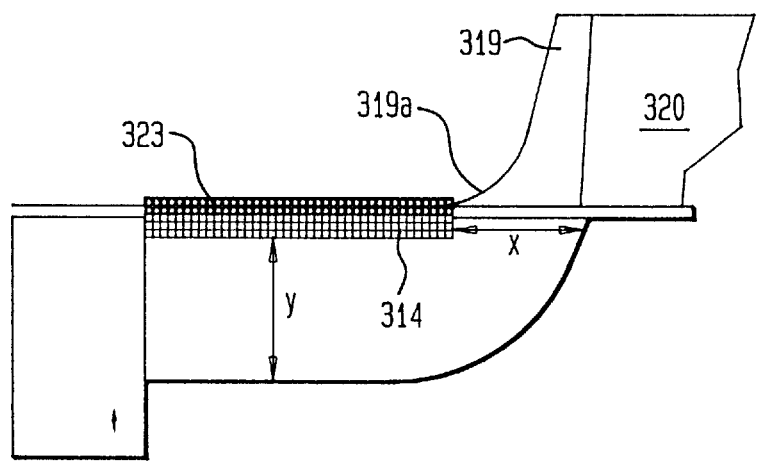

The junctions of devices of the invention can be further improved by independent optimization of the vertical and lateral out-diffusion of ions using a graded gate sidewall spacer. A conventional spacer configuration and resultant graded junction according to the prior art is shown in FIG. 3A. FIG. 3A illustrates a conventional ion implanted buffer layer 323, a gate electrode 320 having a sidewall spacer 319 and a conventional out-diffused, graded junction 327. By modifying the configuration of the sidewall spacer layer to grade it and form a "foot" region 319a, as shown in FIG. 3B, stress relief of the interface between the sidewall spacer layer 319 and the underlying silicon layer 314 and defect reduction is achieved. The second, low dosage, high energy ion implant can penetrate the "foot" 319a of the sidewall spacer 319 into the underlying silicon, thus implanting some ions into the silicon surface. This ion implant augments the lateral out-diffusion for the implanted buffer layer 323 and ensures adequate junction-to-gate overlap, while providing a low temperature process. The vertical diffusion of ions from the implanted buffer layer 323 is shown by arrow "y"; the lateral diffusion of ions from implanted buffer layer 323 is shown by arrow "x". Since this direct ion implant into bulk silicon may cause some crystal damage, the thickness of the "foot" 319a of the graded sidewall spacer 319 can be varied, to permit more or less ion implantation, and consequently permit more or less damage to the silicon as desired. Thus the implant damage to the silicon substrate can be limited, while permitting optimization of ion diffusion both laterally and vertically, independently of each other.

The method of the present invention has several advantages over conventional processing. By confining the high dosage ion implant to a buffer layer, crystal damage to the silicon substrate is avoided. Further, possible defects are located near the source/silicon interface; such shallow defects have much lower activation energy than deep defects. This interface thus acts as a getter for defects during the out-diffusion of dopants.

The second, low dosage, high energy ion implant extends laterally at the junction perimeter because of a larger straggle at high energy, thereby providing a junction-to-gate overlap even at low thermal processing.

By employing a graded gate sidewall spacer, the second, low dosage, high energy ion implant can penetrate the spacer at its foot, thereby allowing some implanted ions to pass into the silicon substrate and ensuring sufficient junction-to-gate overlap. By adjusting the thickness of the spacer foot, more or less implanted ions will pass through to the substrate, thus providing adjustment of the implant damage to the substrate to be tolerated. The resultant graded junction profile, in both vertical and lateral dimensions, provide improved device reliability (hot carrier stability) but without requiring additional mask steps and without defect generation.

Although the invention has been described in terms of specific embodiments, various changes can be made in the order of steps and process conditions as will be known to those skilled in the art, and they are meant to be included herein. The invention is only meant to be limited to the scope of the appended claims.

We claim:

1. A shallow junction metal oxide semiconductor field effect transistor made in accordance with the steps of:

depositing a buffer layer in direct contact with a substrate surface adjacent to a gate electrode;

ion implanting a first dopant at a high dosage, low energy level into the buffer layer;

ion implanting a second dopant at a low dosage, high energy level into the buffer layer;

providing a graded sidewall spacer having a foot portion of variable thickness, the foot portion gradually diminishing in thickness away from the sidewall spacer, that permits a variable number of implanted ions to pass therethrough; and diffusing said ions from said buffer layer into said substrate vertically and laterally under the gate electrode to provide a lateral dopant concentration gradient under the gate electrode and to provide a junction-to-gate overlap without damage to the substrate.

2. A shallow junction metal oxide semiconductor field effect transistor according to claim 1 wherein said first and second dopants are the same.

3. A shallow junction metal oxide semiconductor field effect transistor according to claim 2 wherein said dopant is selected from the group consisting of phosphorus, arsenic, boron and BF2.

4. A shallow junction metal oxide semiconductor field effect transistor according to claim 1 wherein said ions are diffused during a subsequent planarization step.

5. A shallow junction metal oxide semiconductor field effect transistor according to claim 1 wherein said first and second dopants are different.

* * * * *